United States Patent
Reboh et al.

(10) Patent No.: US 10,269,930 B2
(45) Date of Patent: Apr. 23, 2019

(54) METHOD FOR PRODUCING A SEMICONDUCTOR DEVICE WITH SELF-ALIGNED INTERNAL SPACERS

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Emmanuel Augendre, Montbonnot (FR); Remi Coquand, Les Marches (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/837,217

(22) Filed: Dec. 11, 2017

(65) Prior Publication Data

US 2018/0175166 A1 Jun. 21, 2018

(30) Foreign Application Priority Data

Dec. 15, 2016 (FR) ..................................... 16 62532

(51) Int. Cl.
*H01L 21/00* (2006.01)
*H01L 29/66* (2006.01)
(Continued)

(52) U.S. Cl.
CPC .... *H01L 29/66553* (2013.01); *H01L 29/0673* (2013.01); *H01L 29/1033* (2013.01);
(Continued)

(58) Field of Classification Search
None
See application file for complete search history.

(56) References Cited

U.S. PATENT DOCUMENTS

2006/0172468 A1 8/2006 Orlowski
2014/0001441 A1 1/2014 Kim et al.
(Continued)

FOREIGN PATENT DOCUMENTS

WO WO 2013/095651 A1 6/2013

OTHER PUBLICATIONS

French Preliminary Search Report dated Aug. 10, 2017 in French Application 16 62532 filed on Dec. 15, 2016 (with English Translation of Categories of Cited Documents).
(Continued)

*Primary Examiner* — Reema Patel
(74) *Attorney, Agent, or Firm* — Oblon, McClelland, Maier & Neustadt, L.L.P.

(57) ABSTRACT

Method for producing a semiconductor device, comprising:
producing a stack including a first crystalline semiconductor portion intended to form a channel and arranged on at least one second portion which can be selectively etched vis-à-vis the first portion,
producing a dummy gate and external spacers,
etching the stack, a remaining part of the stack under the dummy gate and the external spacers being conserved,
producing source/drain by epitaxy from the remaining part of the stack;
removing the dummy gate and the second portion,
oxidizing portions of the source/drain from the parts of the source/drain revealed by the removal of the second portion, forming internal spacers,
producing a gate electrically insulated from the source/drain by the external and internal spacers.

15 Claims, 5 Drawing Sheets

(51) Int. Cl.
- *H01L 29/06* (2006.01)
- *H01L 29/10* (2006.01)
- *H01L 29/423* (2006.01)
- *H01L 29/786* (2006.01)
- *H01L 29/161* (2006.01)

(52) U.S. Cl.
CPC .... *H01L 29/1054* (2013.01); *H01L 29/42392* (2013.01); *H01L 29/6656* (2013.01); *H01L 29/66545* (2013.01); *H01L 29/66795* (2013.01); *H01L 29/78696* (2013.01); *H01L 29/161* (2013.01)

(56) References Cited

U.S. PATENT DOCUMENTS

| | | |
|---|---|---|
| 2014/0054724 A1 | 2/2014 | Ching et al. |
| 2015/0084041 A1 | 3/2015 | Hur et al. |

OTHER PUBLICATIONS

C.H. Lee et al., "Selective $GeO_x$-Scavenging from Interfacial Layer on $Si_{1-x}Ge_x$ Channel for High Mobility Si/ $Si_{1-x}Ge_x$ CMOS Application," 2016 Symposium on VLSI Technology Digest of Technical Papers, 2016, pp. 2.

E. A. Lewis et al., "The Effect of Surface Orientation on Silicon Oxidation Kinetics", J. Electrochemical Society, vol. 134, No. 9, Sep. 1987, pp. 8.

M. Spadafora et al., "Oxidation Rate Enhancement of SiGe Epitaxial Films Oxidized in Dry Ambient", Applied Physics Letters, vol. 83, No. 18, Nov. 2003, pp. 4.

C. Tetelin et al., "Kinetics and Mechanism of Low Temperature Atomic Oxygen-Assisted Oxidation of SiGe Layers", Journal of Applied Physics, vol. 83, No. 5, Mar. 1998, pp. 6.

U. Konig et al., "Needs of Low Thermal Budget Processing in SiGe Technology", Solid State Phenomena, vols. 47-48., 1996, pp. 17.

F.K. Legoues et al., "Oxidation Studies of SiGe", Journal of Applied Physics, 65, 1724, 1989, pp. 6.

N. Loubet et al. "$Si_{1-x}Ge_x$ /Si Selective Etch with HCl for Thin Si-Channel Transistors Integration", Extended Abstracts of the 2007 International Conference on Solid State Devices and Materials, Tsukuba, 2007, pp. 2.

Bing-Yue Tsui et al. "A Novel Wafer Reclaim Method for Amorphous SiC and Carbon Doped Oxide Films", IEEE Transactions on Semiconductor Manufacturing, vol. 18, No. 4, Nov. 2005, pp. 6.

U.S. Appl. No. 14/555,897, filed Nov. 28, 2014, 2015/0155170 A1, Shay Reboh et al.

U.S. Appl. No. 14/575,329, filed Dec. 18, 2014, 2015/0179474 A1, Sylvain Maitrejean et al.

U.S. Appl. No. 14/901,027, filed Dec. 28, 2015, 2016/0372362 A1, Thomas Signamarcheix et al.

U.S. Appl. No. 14/950,416, filed Nov. 24, 2015, 2016/0149039 A1, Shay Reboh et al.

U.S. Appl. No. 15/049,468, filed Feb. 22, 2016, 2016/0254362 A1, Sylvain Maitrejean et al.

U.S. Appl. No. 15/070,781, filed Mar. 15, 2016, 2016/0276494 A1, Sylvain Barraud et al.

U.S. Appl. No. 15/092,002, filed Apr. 6, 2016, 2016/0300927 A1, Shay Reboh et al.

U.S. Appl. No. 15/261,226, filed Sep. 9, 2016, 2017/0076997 A1, Shay Reboh et al.

U.S. Appl. No. 15/352,198, filed Nov. 15, 2016, 2017/0141212 A1, Sylvain Barraud et al.

U.S. Appl. No. 15/490,212, filed Apr. 18, 2017, 2017/0309483 A1, Shay Reboh et al.

U.S. Appl. No. 15/457,447, filed Mar. 13, 2017, 2017/0263495 A1, Emmanuel Augendre et al.

U.S. Appl. No. 15/452,049, filed Mar. 7, 2017, 2017/0263607 A1, Sylvain Maitrejean et al.

U.S. Appl. No. 15/523,742, filed May 2, 2017, Shay Reboh et al.

U.S. Appl. No. 15/602,829, filed May 23, 2017, 2017/0345931 A1, Shay Reboh et al.

U.S. Appl. No. 15/603,738, filed May 24, 2017, 2017/0345915 A1, Remi Coquand et al.

U.S. Appl. No. 15/711,549, filed Sep. 21, 2017, Shay Reboh et al.

US 10,269,930 B2

METHOD FOR PRODUCING A SEMICONDUCTOR DEVICE WITH SELF-ALIGNED INTERNAL SPACERS

TECHNICAL FIELD AND PRIOR ART

The invention relates to a method for producing a semiconductor device, e.g. a GAA-FET (Gate-All-Around Field Effect Transistor), with internal spacers, or inner spacers, that are self-aligned with respect to each other.

In a GAA-FET type transistor, the gate of the transistor is produced all around the channel such that the channel is surrounded or coated by the gate. Such a transistor has the advantage, compared to a conventional MOSFET, of improving the electrostatic control of the channel by the gate (which makes it possible to reduce leakage currents), notably when the transistor is fully depleted (for example of FD-SOI type, for Fully-Depleted Silicon On Insulator).

It is known to produce a GAA-FET type transistor including a stack of several nanowires of semiconductor together forming the channel of the transistor. This configuration makes it possible to obtain a good compromise between the desired electrostatic control and control current in the transistor.

The addition of a stress in the channel of the transistor contributes to improving the performances of the transistor. This stress is preferably uniaxial and parallel to the direction of movement of the charge carriers in the channel. A compressive stress applied to the channel makes it possible to improve the mobility of the charge carriers in a P-type transistor, whereas a tensile stress will have a beneficial effect in an N-type transistor.

The document US 2014/0054724 A1 describes a method for producing a GAA-FET. In such a transistor, the electrical insulation between the gate and the source and drain regions is ensured by external spacers formed on the initial stack of materials used for the production of the active zone of the transistor, as well as by internal spacers produced within this stack. These internal spacers are necessary to reduce capacitive effects between the gate and the source and drain regions. In this document, the internal spacers are produced by etching, in the semiconductor located against the nanowire(s) of the channel, of one or more cavities intended to be aligned vis-à-vis the external spacers, then carrying out an oxidation of the walls made of semiconductor of the cavity or cavities. This cavity or these cavities are next filled with gate materials.

The method described in this document poses however a problem. Indeed, given that the cavity or the cavities formed within the stack for the production of the internal spacers are obtained by etching without a stop layer, the sought-after alignment between the inner edges of the external spacers and the walls of the cavities is difficult to obtain because it depends on the duration of implementation of the etching. In practice, the internal spacers obtained are not precisely aligned either with the external spacers, or one above the other. This represents a source of variability of the electrical characteristics of the transistor thereby produced, notably due to the fact that the variations in the dimensions of the internal spacers directly influence the length of channel obtained.

DESCRIPTION OF THE INVENTION

Thus there is a need to propose a method for producing a semiconductor device suited to the production of a GAA-FET and in which the internal spacers are produced in a self-aligned manner with respect to each other and with respect to the external spacers.

To do so, one embodiment proposes a method for producing a semiconductor device, comprising at least the implementation of the following steps:

producing, on a substrate, a stack including at least one first portion of crystalline semiconductor intended to form a channel of the semiconductor device and arranged on at least one second portion of at least one material capable of, or having the properties for, being etched selectively vis-à-vis the semiconductor of the first portion;

producing, on a part of the stack, a dummy gate and external spacers between which is arranged the dummy gate;

etching the stack such that only a remaining part of the stack covered by the dummy gate and by the external spacers is conserved, or kept;

producing source and drain regions by semiconductor epitaxy from at least the remaining part of the stack;

removing the dummy gate and the second portion;

oxidising portions of the source and drain regions from the parts of one face of each of the source and drain regions revealed by, or accessible after, the removal of the second portion, the oxidised portions forming internal spacers;

producing a gate between the external spacers, covering the channel and electrically insulated from the source and drain regions by the external spacers and the internal spacers.

Thus, the surfaces from which the internal spacers are produced correspond to the surfaces of the stack formed by the etching implemented using the dummy gate and the external spacers as etching mask. Thus, these surfaces are aligned with respect to the outer walls of the external spacers, which makes it possible to obtain a self-alignment of the internal spacers with respect to each other and with respect to the external spacers. This self-alignment is obtained whatever the number of first portions of semiconductor used to produce the channel. The internal spacers may have a surface which is aligned with the inner walls of the external spacers.

With such a production method, the internal spacers may have a surface that stops in line with the inner walls of the external spacers, that is to say the walls of the external spacers in contact with the dummy gate, and the self-aligned production of the internal spacers then does not modify the channel length of the device and does not impact the electrical performances of the semiconductor device.

The internal spacers correspond to elements intended to electrically insulate the gate vis-à-vis source and drain regions within the stack from which the semiconductor device is produced. The internal spacers are arranged at least in part in source and drain extension regions, between the channel and the source and drain regions.

The external spacers correspond to elements intended to electrically insulate the gate vis-à-vis source and drain regions around the stack from which the semiconductor device is produced. The external spacers cover at least a part of the source and drain extension regions.

Furthermore, compared to internal spacers that would be produced by deposition, the implementation of an oxidation has the advantage of reducing the implementation constraints for the production of internal spacers, such as for example the dimensions or the aspect ratio of the internal spacers that can be produced due to the fact that the production of internal spacers by deposition would impose constraints on the thickness of material deposited compared to the dimensions of the locations of the internal spacers. Furthermore, such a production of internal spacers by deposition of a dielectric material would also impose the implementation of a step of etching of the dielectric material deposited outside the locations provided for the internal spacers. Such a removal step is not necessarily implemented when the internal spacers are produced by oxidation due to the fact that the oxide does not form on all the materials present.

The semiconductor of the source and drain regions may be capable of oxidising more rapidly than the semiconductor of the first portion.

In this case:
- when the semiconductor device is an N-type transistor, the semiconductor of the first portion, for example silicon, may be not doped intentionally and the production of the source and drain regions comprises an N-type doping (for example an in-situ doping during the epitaxy of the source and drain regions) of the semiconductor (for example silicon) of the source and drain regions, or
- when the semiconductor device is a P-type transistor, the semiconductor of the first portion may be silicon or SiGe, and the semiconductor of the source and drain regions may be SiGe comprising a proportion of germanium greater than that of the semiconductor of the first portion.

Thus, when the semiconductor device corresponds to an N-type transistor, the difference in rate of oxidation between the semiconductor of the first portion and that of the source and drain regions may be obtained advantageously thanks to a difference in doping of the semiconductors (the N-doped semiconductor oxidising more rapidly than the semiconductor not doped intentionally).

When the semiconductor device corresponds to a P-type transistor, the difference in rate of oxidation between the semiconductor of the first portion and that of the source and drain regions may be obtained advantageously thanks to the difference in concentrations, or proportions, of germanium in the semiconductors (that having the highest concentration of germanium being oxidised more rapidly and/or at lower temperature than the other semiconductor).

When the semiconductor device is an N-type transistor, the dopants of the semiconductor of the source and drain regions may be phosphorous or arsenic atoms.

When the semiconductor device is a P-type transistor, the material of the second portion may be SiGe, and a proportion of germanium in the semiconductor of the source and drain regions may be lower by at least 5% compared to that in the SiGe of the second portion.

The oxidation of portions of the source and drain regions may be implemented at a temperature between around 700° C. and 900° C. At such temperatures, the diffusion of dopants into the channel of the device is limited. Furthermore, the implementation of the oxidation at such temperatures is advantageous because the selectivity of oxidation obtained thanks to the different dopings and/or to the different compositions of the materials is enhanced.

The method may further comprise the implementation, between the steps of oxidation of portions of the source and drain regions and of producing the gate, the implementation of a step of removing an oxidised part of the material of the first portion. When the semiconductor of the source and drain regions is capable of oxidising more rapidly than the semiconductor of the first portion, this oxidised part of the material of the first portion may thus be minimised in order to limit the impact of the oxidation on the first portion of material.

The method may further comprise, after the removal of the oxidised part of the material of the first portion, a step of depositing a stressed semiconductor material around the first portion. In this case, the oxidation of the first portion and the removal of the oxidised part of the first portion serve to carry out a thinning of the first portion. After this thinning, it is possible to deposit around the remaining part of the first portion a stressed semiconductor material, for example SiGe, providing a compressive stress to the channel.

The method may further comprise, between the step of etching the stack and the step of producing the source and drain regions, the implementation of the steps of:
- removing the second portion,
- depositing at least one material, different to that of the second portion and capable of being etched selectively vis-à-vis the semiconductor of the first portion, in at least one space formed by the removal of the second portion, and the material deposited in the space formed by the removal of the second portion may be removed after the removal of the dummy gate.

Thus, it is possible to carry out the epitaxy of the source and drain regions in the presence of a material that cannot be obtained in the initial stack, such as for example a dielectric material such as $SiO_2$.

The production of the source and drain regions may comprise at least the implementation of a first epitaxy from the remaining part of the stack, forming a first part of the source and drain regions, then a second epitaxy from the first part of the source and drain regions, forming a second part of the source and drain regions. By producing in this way the source and drain regions in the form of two separate epitaxied parts, it is possible to implement these epitaxies such that the materials of the two epitaxies have different properties.

The first epitaxy may be implemented such that the first part of the source and drain regions comprises a semiconductor capable of oxidising more rapidly than that of the second part of the source and drain regions.

Thus, the first epitaxy may be implemented such that the first part of the source and drain regions comprises semiconductor, for example silicon, including carbon atoms. In this case, this first part of the source and drain regions may have the property of oxidising at lower temperature (similar behaviour to SiGe). Furthermore, this first part of the source and drain regions makes it possible to reduce the diffusion of dopants (those present in the source and drain regions) into the channel during the epitaxy of the second part of the source and drain regions.

It is also possible, when the source and drain regions comprise SiGe, that the first and second epitaxies are implemented such that the proportion of germanium in the semiconductor of the first part of the source and drain regions is greater than that in the semiconductor of the second part of the source and drain regions. In this case, the material of the first part of the source and drain regions has the property of oxidising more rapidly than that of the second part of the source and drain regions. The rate of oxidation of the source and drain regions is thus reduced after having reached the second part of the source and drain regions. This configuration thus makes it possible to limit automatically the depth (dimension parallel to the greatest dimension, or length, of the nanowires) of the internal spacers within the source and drain regions.

The second portion may comprise a crystalline material, and the epitaxy forming the source and drain regions may be implemented from at least the crystalline materials of the second portion and the first portion. Thus, the epitaxy of the source and drain may be implemented from a surface entirely formed of crystalline materials because the crystalline property of the semiconductor of the first portions is not interrupted by the presence of one or more second portions made of non-crystalline material. The source and drain regions are thereby formed by a coherent crystalline material, without crystallinity defect due to the second portion(s).

When the material of the substrate on which is arranged the stack is also a crystalline material, the surface of this material also serves for the growth of the crystalline material of the source and drain regions.

The epitaxy of the source and drain regions may be implemented such that the semiconductors of the source and drain regions and the first portion have a difference in lattice parameters inducing a stress in the channel. The addition of such a stress in the channel contributes to improving the performances of the transistor. This stress is preferably uniaxial and parallel to the direction of movement of the charge carriers in the channel. When the semiconductor device corresponds to a P-type transistor, this stress may correspond to a compressive stress applied to the channel, which makes it possible to improve the mobility of the charge carriers in the transistor. When the semiconductor device corresponds to an N-type transistor, this stress may correspond to a tensile stress.

The addition of a stress in the channel is carried out preferably when the epitaxy forming the source and drain regions is implemented from at least the crystalline materials of the second portion and the first portion, that is to say when the second portion comprises a crystalline material and thus that the source and drain regions are obtained by growth from a crystalline interface which is not interrupted by the presence of an non-crystalline material. Indeed, a stress in the channel based on a difference in lattice parameters between the semiconductor of the channel and that of the source and drain regions strongly depends on the crystalline quality of the semiconductor forming the source and drain regions. Source and drain regions comprising a coherent, or continuous, crystalline semiconductor without crystallinity defect make it possible to maximise this stress.

The stack produced initially may comprise several first portions of semiconductor each forming a nanowire arranged between two second portions. In the initial stack, two neighbouring nanowires are spaced apart by one of the second portions.

The semiconductor device may advantageously be a GAA-FET.

BRIEF DESCRIPTION OF THE DRAWINGS

The present invention will be better understood on reading the description of exemplary embodiments given for purely illustrative purposes and in no way limiting and by referring to the appended drawings in which.

Identical, similar or equivalent parts of the different figures described hereafter bear the same numerical references in order to make it easier to go from one figure to the next.

The different parts shown in the figures are not necessarily according to a uniform scale, in order to make the figures more legible.

The different possibilities (alternative embodiments and embodiments) should be understood as not being mutually exclusive and may be combined together.

DETAILED DESCRIPTION OF PARTICULAR EMBODIMENTS

Reference is firstly made to FIGS. 1A to 1H which show the steps of a method for producing a semiconductor device 100, here corresponding to a P-type GAA-FET, according to a first embodiment.

Figure 1A:
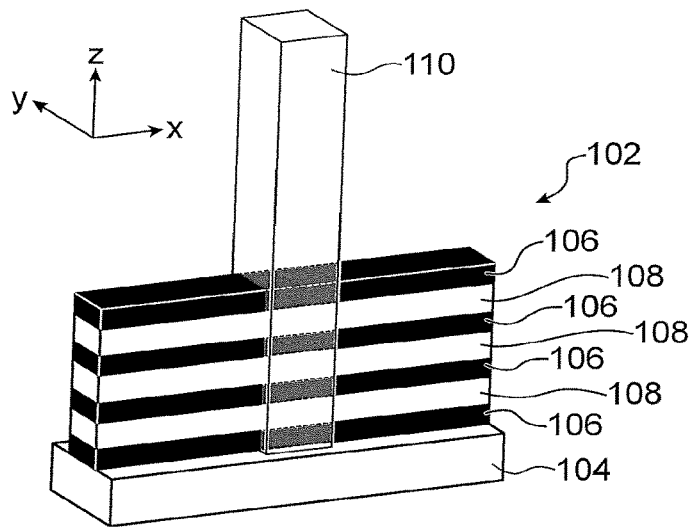
FIGS. 1A to 1H show the steps of a method for producing a semiconductor device according to a first embodiment.

As shown in FIG. 1A, the device 100 is produced from a stack 102 of layers of different materials arranged on a substrate 104. In the first embodiment described here, the substrate 104 corresponds to a bulk substrate, of semiconductor, for example silicon or SiGe, on which is arranged the stack 102 including layers 106, 108 of two different materials arranged in an alternate manner one above the other. Each of the layers 108 is intended to form a semiconductor nanowire of the channel of the device 100 and is arranged between two layers 106 comprising a material capable of being etched selectively compared to that of the layers 108. In the first embodiment described here, the stack 102 comprises three layers 108 as well as four layers 106 arranged in an alternate manner such that each of the layers 108 is arranged between two layers 106.

In an alternative embodiment, the substrate used may also correspond to a SOI (silicon on insulator) substrate, with in this case the reference 104 which designates the buried dielectric layer, or BOX (Buried Oxide) of the SOI substrate and the first layer 106 (that arranged against the layer 104) which designates the superficial layer or thin layer, of the SOI substrate.

The term nanowire is used herein to designate any portion of material of nanometric dimensions and of lengthened shape, whatever the shape of the section of this portion. Thus, this term designates not just lengthened portions of material of circular or substantially circular section, but also portions of material in the shape of nanobeams or nanobars comprising for example a rectangular or substantially rectangular section.

In the example described here, the substrate 104 and the layers 108 comprise silicon and the layers 106 comprise SiGe with a proportion of germanium for example between around 30% ($Si_{0.7}Ge_{0.3}$) and 60% ($Si_{0.4}Ge_{0.6}$).

The stack 102 is etched in the form of a lengthened portion such as shown in FIG. 1A. The width of this portion, which corresponds to the dimension along the Y axis, is equal to the desired width of the nanowires of the channel of the device 100 that will be formed by the portions of the layers 108 obtained at the end of this etching.

A dummy gate 110 is next produced, for example by lithography and etching, on the stack 102, at the location intended for the future gate of the device 100. The dummy gate 110 is arranged above the parts of the layers 108 intended to form the nanowires, that is to say the channel of the device 100, and the parts of the layers 106 between which are located these parts of the layers 108, and also covers the lateral sides of these parts of the layers 108 and 106.

External spacers 112 are next produced, for example by deposition and etching, on the stack 102, and against the lateral sides of the dummy gate 110. These external spacers 112 are notably arranged above parts of the layers 108 intended to be located in the source and drain extension regions, that is to say between the channel and the source and drain regions of the device 100. The length, or depth, of these spacers (dimensions parallel to the X axis shown in FIG. 1A) is for example between around 3 and 8 nm.

Figure 1B:
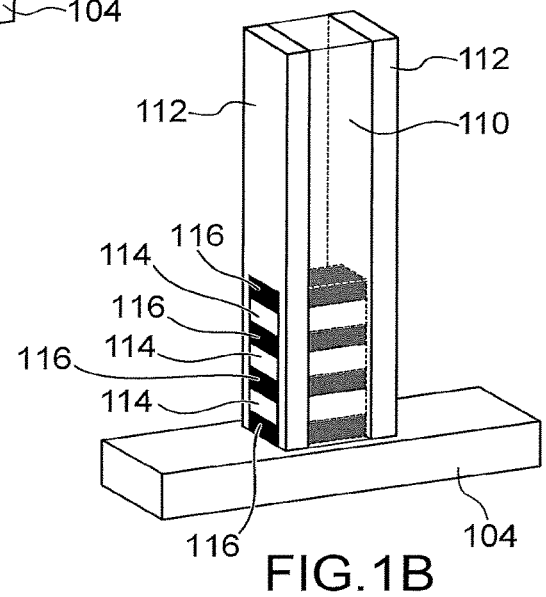

The parts of the stack 102 not covered by the dummy gate 110 and by the external spacers 112 are next etched (FIG. 1B). The remaining portions of the layers 108 form nanowires 114 of the channel of the device 100. Each of the nanowires 114 is interposed between two remaining portions 116 of the layers 106.

Figure 1C:
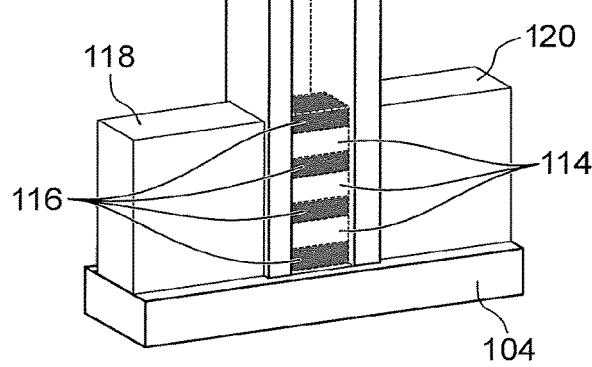
Figure 1D:
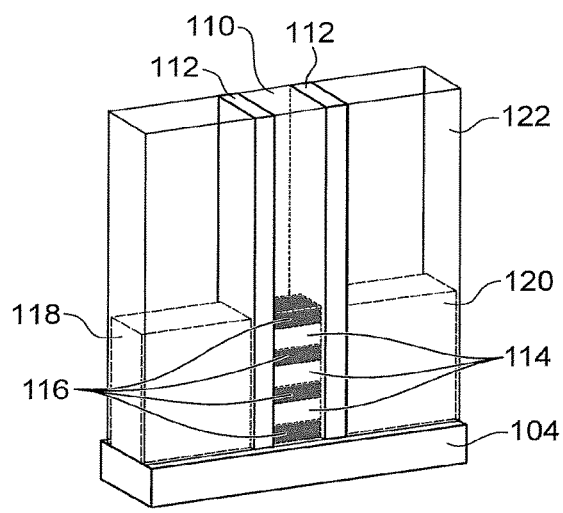

As shown in FIG. 1C, source and drain regions 118, 120 are next formed by epitaxy on the substrate 104, from the ends of the nanowires 114 and the portions 116 and the bulk substrate 104. These regions 118, 120 are produced with an in-situ doping so as to obtain good junction quality. For example, the doping of the material of the regions 118, 120 may be carried out with boron doping atoms, the concentration of which is for example between around $10^{18}$ and $10^{21}$ at/cm$^3$. The material of the source and drain regions 118, 120 is here SiGe:B.

In the first embodiment described here, the source and drain regions 118, 120 comprise SiGe. The concentration of germanium of the SiGe of the source and drain regions 118, 120 is for example between around 20% ($Si_{0.8}Ge_{0.2}$) and 80%. ($Si_{0.2}Ge_{0.8}$)

In this first embodiment, internal spacers of the device 100 are intended to be produced by oxidising portions of the source and drain regions 118, 120. However, this oxidation is also going to impact the semiconductor of the nanowires 114. In order that the implementation of this oxidation does not transform into oxide the totality of the semiconductor of the nanowires 114 of the channel, the material of the source and drain regions 118, 120 is chosen such that its rate of oxidation is greater than that of the material of the nanowires 114. Thus, in the exemplary embodiment described here, this property is obtained thanks to the production of nanowires 114 made of silicon and source and drain regions made of SiGe with a concentration of germanium between around 20% and 80%. Generally speaking, in a P-type transistor, the concentration of germanium in the semiconductor of the source and drain regions 118, 120 may be greater than that in the semiconductor of the nanowires 114.

The higher the concentration of germanium in the SiGe of the source and drain regions 118, 120, the more rapidly this semiconductor of the source and drain regions 118, 120 will oxidise compared to the semiconductor of the nanowires 114, and/or the lower the temperature at which the oxidation is implemented.

Furthermore, the material of the source and drain regions 118, 120 is also chosen such that it is more resistant than that of the layers 106 vis-à-vis the etching implemented later to remove the remaining portions 116 of the layers 106 and release the nanowires 114. Thus, when the layers 106 and the source and drain regions 118, 120 comprise SiGe, the concentration of germanium in the SiGe of the source and drain regions 118, 120 is advantageously lower than in the SiGe of the layers 106, and preferably lower by at least 5% or by at least 10% compared to that of the SiGe of the layers 106. This difference in concentration of germanium is respected preferably at least in one part of the source and drain regions 118, 120 located against the ends of the nanowires 114 and the portions 116 serving for the epitaxy of the source and drain regions 118, 120. The material forming the remainder of the source and drain regions 118, 120 may be different, as much in terms of germanium concentration as doping.

In this first embodiment, due to the fact that the epitaxy forming the source and drain regions 118, 120 is implemented from the ends of the remaining portions 116 and the nanowires 114 which together form a continuous crystalline surface, and potentially from the substrate 104 when it comprises a crystalline semiconductor, each of the source and drain regions 118, 120 obtained forms a coherent semiconductor crystal with the remaining portions of the layers 106, 108 and potentially with the substrate 104 when it comprises a crystalline semiconductor. It is thereby possible to introduce in the source and drain regions 118, 120 a difference in lattice parameters, thereby inducing a stress in the channel of the device 100.

An encapsulation material 122 is next deposited on the source and drain regions 118, 120 (FIG. 1D) in order not to alter these regions during the implementation of the later steps.

Figure 1E:
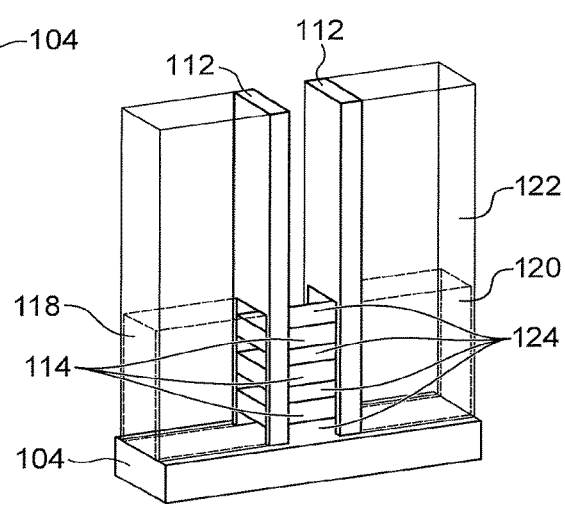

The dummy gate 110 is next etched, revealing the nanowires 114 and also forming accesses to the portions 116. A selective etching of the remaining portions 116 vis-à-vis the nanowires 114, the source and drain regions 118, 120 and the external spacers 112 is next implemented in order to release the nanowires 114 forming the channel of the transistor 100. Furthermore, the etching of the remaining portions 116 forms cavities 124 at the locations previously occupied by the ends of the remaining portions 116 of the layers 106 covered by the external spacers 112, in the source and drain extension regions (FIG. 1E). This etching corresponds for example to a HCl/H$_2$ chemical etching.

The bottom walls of these cavities 124 are formed by the source and drain regions 118, 120. These walls are self-aligned with respect to each other, and aligned one above the other due to the fact that they have been defined by the implementation of the etching of the stack 102 removing the portions of the stack 102 not covered by the dummy gate 110 and by the external spacers 112.

Figure 1F:
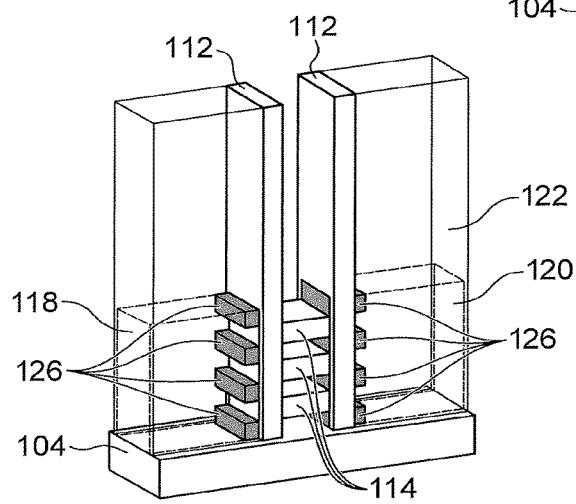

An oxidation of portions of the source and drain regions 118, 120, from the surfaces forming the bottom walls of the cavities 124, is next implemented. This oxidation forms, at the source and drain extension regions, internal spacers 126 including a dielectric material with low permittivity (low-k) and intended to insulate these regions vis-à-vis the gate that will be produced later (FIG. 1F).

Due to the fact that the internal spacers 126 are formed by oxidation, a first part of the oxide forming these spacers 126 (around 50%) is formed within the source and drain regions 118, 120, and a second part of the oxide forming the spacers 126 (around 50%) grows in an opposite direction (direction going from the bottom walls of the cavities 124 in the direction of the location intended for the gate), in the source and drain extension regions which are surrounded by the external spacers 112. The length, or depth (dimension parallel to the X axis), of each internal spacer 126 is for example equal to around 6 nm.

During this oxidation, a part of the nanowires 114 oxidises. However, on account of the materials used (nanowires 114 made of silicon and source and drain regions 118, 120 made of SiGe), the oxidation of the nanowires 114 is slower than that of the portions of the source and drain regions 118, 120 located at the bottom of the cavities 124 and intended to form the internal spacers 126. In the first embodiment described here, this difference in rate of oxidation is due to the high concentration of germanium in the source and drain regions 118, 120 which enables an oxidation of the SiGe more rapid than that of the silicon of the nanowires 114. For example, by considering SiGe in which the concentration of germanium is equal to around 50% ($Si_{0.5}Ge_{0.5}$) and an oxidation forming an oxide of thickness equal to around 10 nm, the thickness of oxide obtained by the implementation of this oxidation on silicon is between around 1 nm and 6 nm (thickness varying notably depending on whether a native oxide is present on the surface of the silicon of the nanowires 114, or whether the nanowires 114 have undergone beforehand a de-oxidation, for example with a solution of HF, removing this native oxide).

Preferably, this oxidation is implemented at a low temperature between around 700° C. and 900° C. in order to avoid diffusion of the dopants into the channel of the device 100. Moreover, the lower the temperature at which the oxidation is implemented, the greater the selectivity of oxidation obtained thanks to the different dopings and/or to the different compositions of the oxidised materials.

In certain cases, higher temperatures may however be envisaged because an increase in the temperature of implementation of the oxidation enables a more rapid oxidation of the materials. For example, by implementing the oxidation at a temperature of around 1100° C. on $Si_{0.5}Ge_{0.5}$, a thickness of oxide of around 8 nm is obtained after 1 second of oxidation, the thickness of oxide formed on silicon being 4 nm for a same oxidation time.

The higher the concentration of germanium in the source and drain regions 118, 120, the greater the selectivity of the oxidation compared to the semiconductor of the nanowires 114. A high selectivity confers notably a greater latitude in the choice of the duration and the temperature of implementation of the oxidation.

This oxidation is for example a plasma enhanced oxidation or a dry oxidation in the presence of oxygen, or instead an annealing under oxidising atmosphere.

Next, the thickness of oxide formed around, or at the ends, of the nanowires 114 is removed by etching. When the germanium oxide is removed, it is possible to implement a method such as described in the document "Selective $GeO_x$-Scavenging from Interfacial Layer on $Si_{1-x}Ge_x$ Channel for High Mobility $Si/Si_{1-x}Ge_x$ CMOS Application" of C. H. Lee et al., 2016 Symposium on VLSI Technology Digest of Technical Papers, pages 36-37.

This etching also impacts the semiconductor oxide of the internal spacers 126 and thus also removes a similar thickness of oxide of the internal spacers 126. At the end of this etching, the internal spacers 126 have a length, or depth, corresponding to the difference between the initial length of the internal spacers 126 and the thickness of oxide removed by the implementation of this etching, and for example between around 1 nm and 2.5 nm.

Figure 1G:
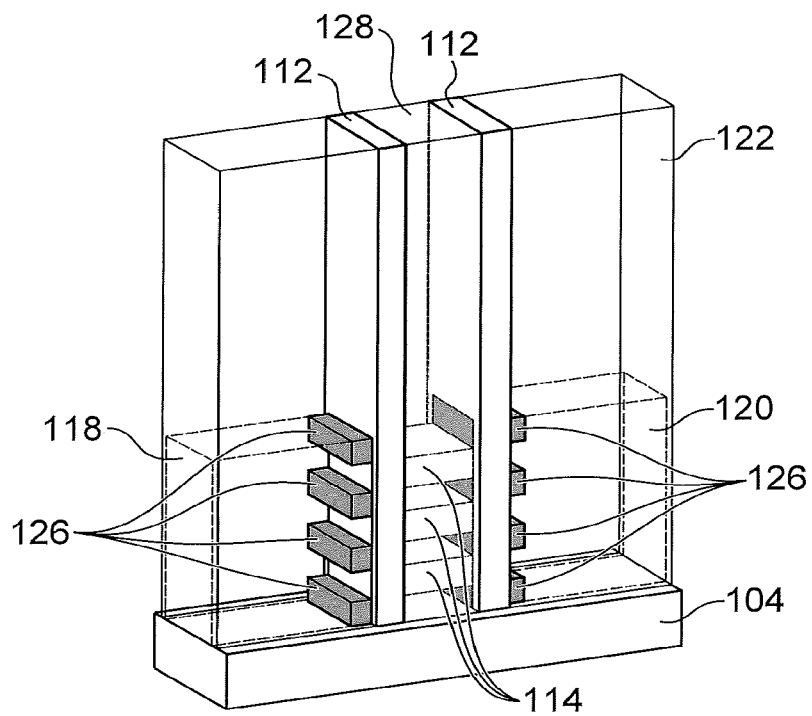

A gate 128, including at least one gate dielectric and one gate conducting material, is next produced between the external spacers 112, at the location previously occupied by the dummy gate 110 (FIG. 1G). The gate 128 thereby produced surrounds the nanowires 114 and is electrically insulated from the source and drain regions 118, 120 by the internal spacers 126 and the external spacers 112.

Thus, the internal spacers 126 make it possible to reduce capacitive effects between the gate 128 and the source and drain regions 118, 120.

Figure 1H:
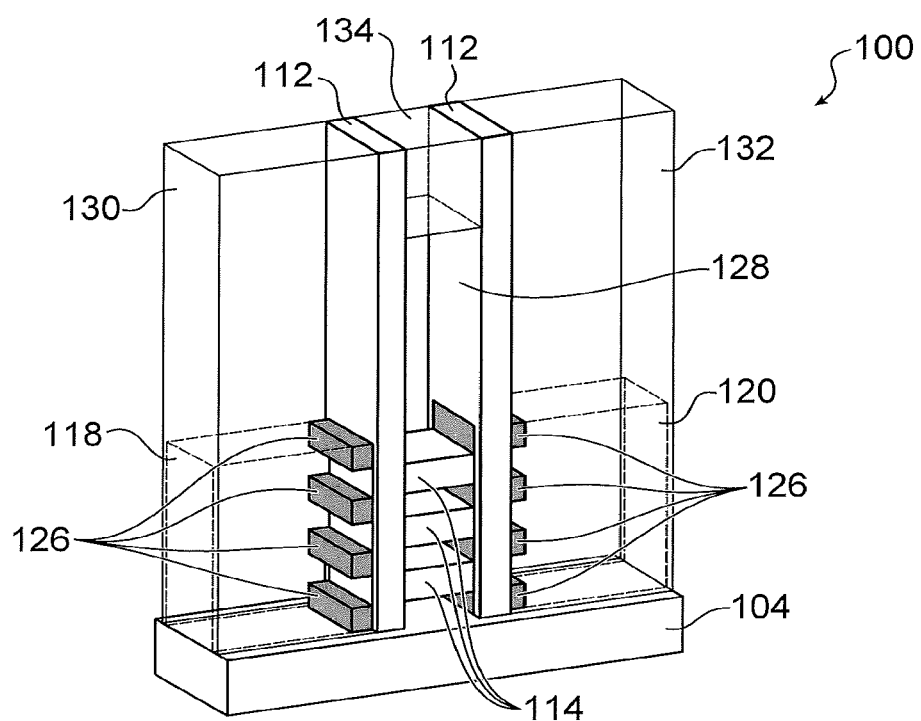

The device 100 is completed by removing the encapsulation material 122 and by forming electrical contacts 130, 132 and 134 on the source and drain regions 118, 120 and on the gate 128 (FIG. 1H).

A method for producing a semiconductor device 100, here corresponding to a P-type GAA-FET, according to a second embodiment, is now described.

The steps previously described in relation with FIGS. 1A and 1B are firstly implemented.

Figure 2A:
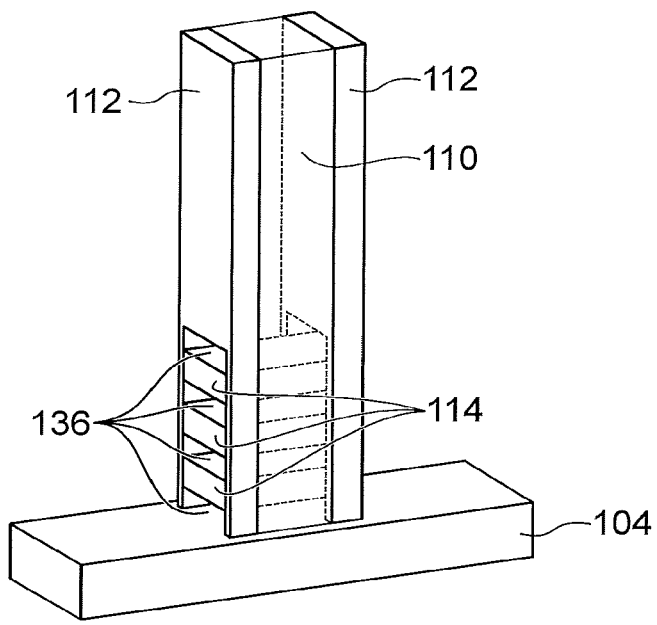
FIGS. 2A and 2B show a part of the steps of a method for producing a semiconductor device according to a second embodiment.

The portions 116 are next etched selectively vis-à-vis the other materials present (this selective etching being able to be carried out thanks to the fact that the concentration of germanium in the semiconductor of the layers 106 is greater than that in the semiconductor of the layers 108), forming cavities 136 between which are located the nanowires 114 (FIG. 2A).

Figure 2B:
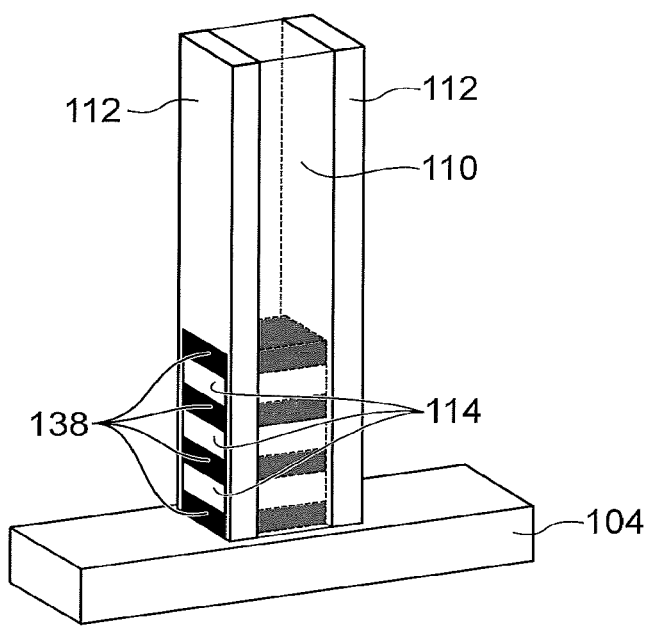

A material capable of being etched selectively compared to the nanowires 114, the source and drain regions 118, 120 and the external spacers 112 is next deposited in the cavities 136, forming portions 138 between which the nanowires 114 are arranged (FIG. 2B).

The method is next completed in an analogous manner to the first embodiment, that is to say by implementing the steps described previously in relation with FIGS. 1C to 1H.

In this second embodiment, the material of the initial stack located between the nanowires of the device 110 is replaced by another material. Thus, this second embodiment may be implemented when the desired material between the nanowires cannot be obtained during the production of the stack of layers 106, 108.

The material of the portions 138 corresponds for example to a semiconductor such as SiGe with a high concentration of germanium, or instead germanium. For example, when the source and drain regions 118, 120 are intended to be produced later in SiGe, the concentration of germanium in the SiGe of the portions 138 may be greater by at least 20% compared to that of the SiGe of the source and drain regions 118, 120. In this case, the portions 138 may be formed via a selective deposition method such that the material of the portions 138 is deposited only around the nanowires 114.

In an alternative embodiment, the material of the portions 138 may be a dielectric material such as $SiO_2$, such a dielectric material not being able to be found initially in a stack of crystalline layers formed by epitaxy. In this case, the dielectric material deposited outside the cavities 136 (on account of the non-selective deposition that is implemented to form such portions) is removed before the continuation of the method.

For the first and second embodiments, it is possible that the source and drain regions 118, 120 are obtained by implementing several epitaxies enabling the growth of materials of different compositions (for example by varying the concentration of germanium between the epitaxies) and/or different concentrations of dopants. For example, the production of the source and drain regions 118, 120 may comprise the implementation of a first SiGe epitaxy comprising carbon atoms, then a second SiGe epitaxy not comprising carbon atoms. Thus, due to the fact that the epitaxy is implemented with an in-situ doping of the source and drain regions 118, 120 formed, the portion of SiGe including carbon atoms formed initially makes it possible to reduce the diffusion of dopants into the channel region of the device 100.

Another advantageous alternative embodiment, for the production of a P-type transistor, may consist in producing the source and drain regions by implementing a first SiGe epitaxy with a high concentration of germanium (for example between around 40% and 60%), then a second SiGe epitaxy with a lower concentration of germanium (for example between around 20% and 30%). Thus, during the production of the internal spacers 126 by oxidation, the thickness of the SiGe at high concentration of germanium is going to form a limit of depth of oxidation for the internal spacers 126 that will be obtained, thereby enabling a self-limitation of the length, or depth, of the internal spacers 126 in the source and drain regions 118, 120.

Such a self-limitation of the depth of the internal spacers may also be obtained, for the production of an N-type transistor, by implementing a first Si epitaxy with a high concentration of P or As dopants, then a second Si epitaxy with a lower concentration of dopants. Thus, during the production of the internal spacers 126 by oxidation, the thickness of the strongly doped silicon is going to form a limit of depth of oxidation for the internal spacers 126 that will be obtained.

The method according to the different embodiments previously described may be implemented to form a device 100 corresponding to an N-type transistor. In this case, the material of the layers 108 (and thus also the material of the nanowires 114) and that of the source and drain regions 118, 120 obtained by epitaxy may correspond to silicon or SiGe. When the source and drain regions 118, 120 comprise silicon, the difference required between the rate of oxidation of the material of the source and drain regions 118, 120 and that of the material of the nanowires 114 is obtained for example by strongly doping the silicon of the source and drain regions 118, 120 by dopants of phosphorous or arsenic type which give to the silicon of the source and drain regions 118, 120 the desired electrical properties and a capacity to oxidise more rapidly than silicon not doped intentionally.

As an example, for an oxidation of silicon doped with phosphorous (Si:P) with a concentration of dopants of around $3.10^{20}$ at/cm$^3$ implemented at around 800° C., an oxide layer of thickness equal to around 10 nm is formed after around 10 minutes of implementation of the oxidation. For silicon not doped intentionally (concentration of dopants equal to around $10^{15}$ at/cm$^3$), a duration of implementation of the oxidation of around 60 minutes is necessary to obtain a thickness of oxide of around 10 nm.

In an alternative embodiment, an N-type transistor may be produced by using SiGe instead of silicon.

The characteristics of the oxidation implemented as a function of the crystalline orientation of the semiconductors used are described for example in the document "The Effect of Surface Orientation on Silicon Oxidation Kinetics" of E. A. Lewis et al., J. Electrochem. Soc. 1987, vol. 134, issue 9, pp. 2332-2339.

A method for producing a P-type transistor, according to a third embodiment, will now be described.

The steps described previously in relation with FIGS. 1A to 1F are firstly implemented.

Figure 3A:
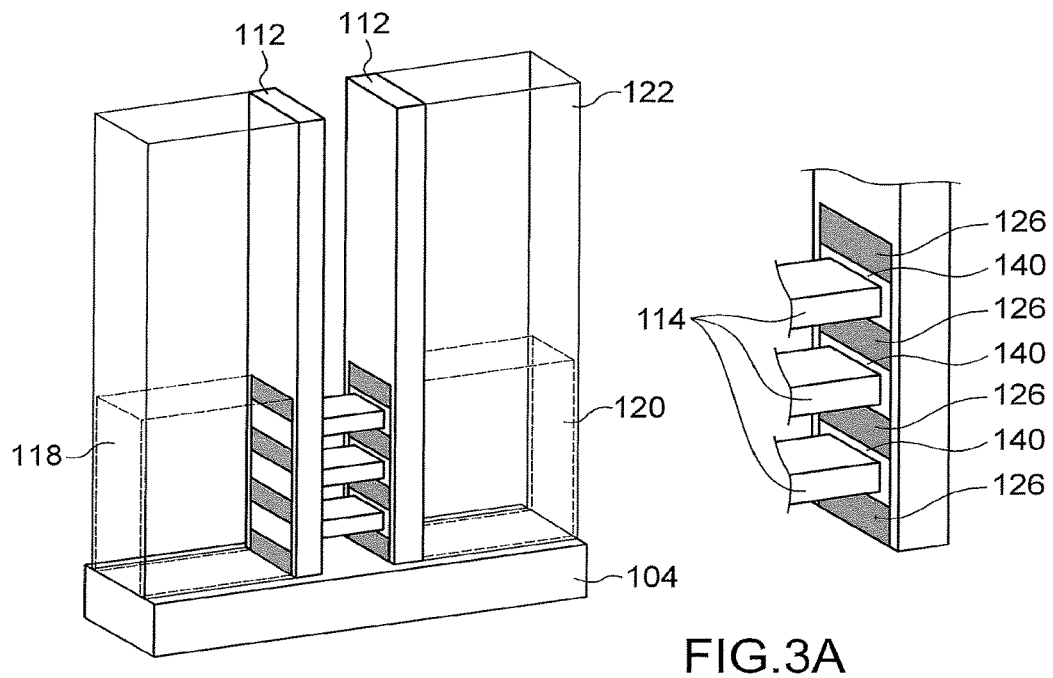
FIGS. 3A and 3B show a part of the steps of a method for producing a semiconductor device according to a third embodiment.

Next, the nanowires 114 are thinned by at least a thickness between around 1 nm and 3 nm in order to expose the parts 140 derived from the layers 108 located in the source and drain extension regions (parts of semiconductor surrounded by the external spacers 112) and which are arranged between the internal spacers 126 (FIG. 3A). This thinning may be obtained by implementing an oxidation of the semiconductor of the nanowires 114 then an etching of the oxidised semiconductor. These steps may be implemented simultaneously, or in the course of a same series of steps, with the steps of oxidation and etching forming the internal spacers 126.

Figure 3B:
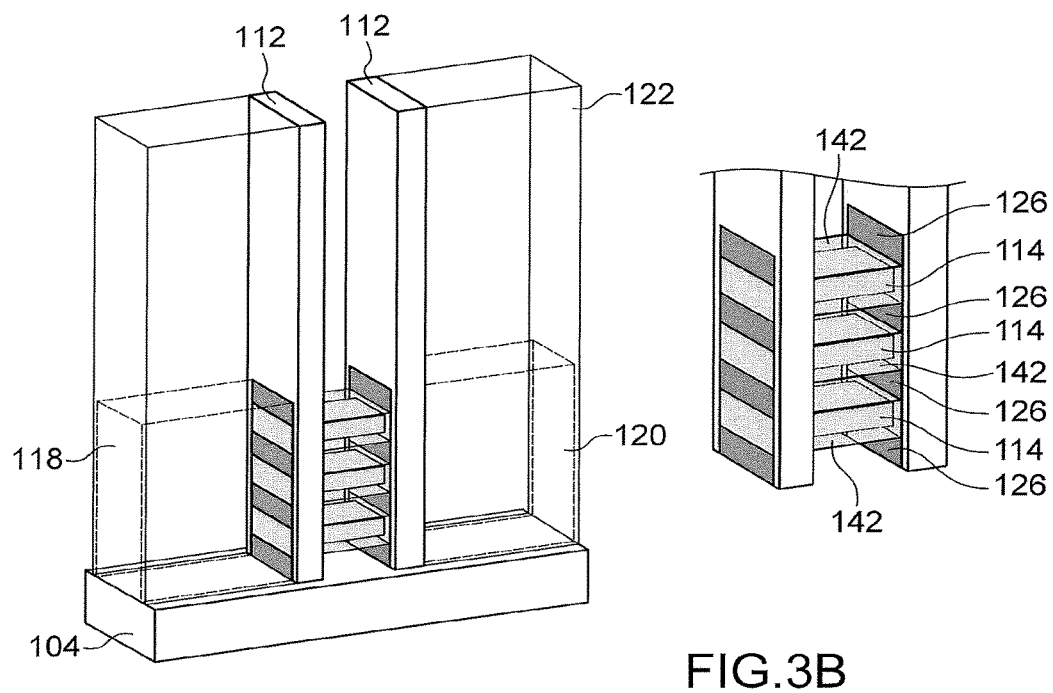

An SiGe epitaxy is next implemented on the thinned nanowires 114 (FIG. 3B). The epitaxied layers of SiGe 142 surround the remaining portion of silicon of each nanowire 114. Advantageously, the thickness of the epitaxied layer of SiGe 142 is substantially equal to the thickness of semiconductor etched to form the thinned nanowires. Thus, the outer edges of the layer of SiGe are aligned with the initial interfaces (before thinning) between the internal spacers 126 and the nanowires 114.

A thermal annealing may next be implemented in such a way as to diffuse the germanium of the layers 142 into the silicon of the nanowires 114 in order to obtain a more homogeneous material forming the channel of the device 100. This annealing may also modify the semiconductor located in the source and drain extension regions (portions of semiconductor derived from the layers 108 and located between the internal spacers 126) on account of the migration of germanium which can come from the layers 142 or instead from the source and drain regions 118, 120, making it possible to obtain a more homogeneous material also in the source and drain extension regions.

The method is next completed as previously described for the first embodiment, that is to say by implementing the steps described previously in relation with FIGS. 1G and 1H.

In this third embodiment, the layer 142 of SiGe forms, around the silicon of the thinned nanowire 114, a compressive stressed semiconductor.

The invention claimed is:

1. A method for producing a semiconductor device, comprising at least:
   producing, on a substrate, a stack including at least one first crystalline semiconductor portion intended to form a channel of the semiconductor device and arranged on at least one second portion of at least one material capable of being etched selectively vis-à-vis the semiconductor of the first portion,
   producing, on a part of the stack, a dummy gate and external spacers between which is arranged the dummy gate,
   etching the stack such that only a remaining part of the stack covered by the dummy gate and by the external spacers is conserved,
   producing source and drain regions by semiconductor epitaxy from at least the remaining part of the stack,
   removing the dummy gate and the second portion,
   oxidizing portions of the source and drain regions from parts of one face of each of the source and drain regions revealed by the removal of the second portion, the oxidized portions forming internal spacers,
   producing a gate between the external spacers, covering the channel and electrically insulated from the source and drain regions by the external spacers and the internal spacers.

2. The method according to claim 1, in which the semiconductor of the source and drain regions is capable of oxidizing more rapidly than the semiconductor of the first portion.

3. The method according to claim 2, in which:
   when the semiconductor device is an N-type transistor, the semiconductor of the first portion is not doped intentionally and the production of the source and drain regions comprises an N-type doping of the semiconductor of the source and drain regions, or
   when the semiconductor device is a P-type transistor, the semiconductor of the first portion is silicon or SiGe, and the semiconductor of the source and drain regions is SiGe comprising a proportion of germanium greater than that of the semiconductor of the first portion.

4. The method according to claim 1, in which, when the semiconductor device is a P-type transistor, the material of the second portion is SiGe, and a proportion of germanium in the semiconductor of the source and drain regions is lower by at least 5% compared to that in the SiGe of the second portion.

5. The method according to claim 1, in which the oxidation of the portions of the source and drain regions is implemented at a temperature between around 700° C. and 900° C.

6. The method according to claim 1, further comprising the implementation, between the steps of oxidising portions of the source and drain regions and producing the gate, of a step of removing an oxidized part of the material of the first portion.

7. The method according to claim 6, further comprising, after the removal of the oxidized part of the material of the first portion, a step of depositing a stressed semiconductor material around the first portion.

8. The method according to claim 1, further comprising, between the step of etching the stack and the step of producing the source and drain regions, the implementation of the steps of:
   removing the second portion,
      depositing at least one material, different to that of the second portion and capable of being etched selectively vis-à-vis the semiconductor of the first portion, in at least one space formed by the removal of the second portion,
   and in which the material deposited in the space formed by the removal of the second portion is removed after the removal of the dummy gate.

9. The method according to claim 1, in which the production of the source and drain regions comprises at least the implementation of a first epitaxy from the remaining part of the stack, forming a first part of the source and drain regions, then a second epitaxy from the first part of the source and drain regions, forming a second part of the source and drain regions.

10. The method according to claim 9, in which the first epitaxy is implemented such that the first part of the source and drain regions comprises a semiconductor capable of oxidizing more rapidly than that of the second part of the source and drain regions.

11. The method according to claim 10, in which at least one of the following conditions is fulfilled:
   the first epitaxy is implemented such that the first part of the source and drain regions comprises semiconductor including carbon atoms,
   when the source and drain regions comprise SiGe, the first and second epitaxies are implemented such that the proportion of germanium in the semiconductor of the first part of the source and drain regions is greater than that in the semiconductor of the second part of the source and drain regions.

12. The method according to claim 1, in which the second portion comprises a crystalline material, and the epitaxy forming the source and drain regions is implemented from at least the crystalline materials of the second portion and the first portion.

13. The method according to claim 1, in which the epitaxy of the source and drain regions is implemented such that the semiconductors of the source and drain regions and the first portion have a difference in lattice parameters inducing a stress in the channel.

14. The method according to claim 1, in which the stack produced initially comprises several first portions of semiconductor each forming a nanowire arranged between two second portions.

15. The method according to claim 1, in which the semiconductor device is a GAA-FET.

* * * * *